(12) United States Patent
Zhong et al.

(10) Patent No.: US 7,919,407 B1
(45) Date of Patent: Apr. 5, 2011

(54) METHOD OF HIGH DENSITY FIELD INDUCED MRAM PROCESS

(75) Inventors: Tom Zhong, Saratoga, CA (US);
Wai-Ming Johnson Kan, San Ramon, CA (US); Daniel Liu, San Jose, CA (US); Adam Zhong, Milpitas, CA (US); Chyu-Jiuh Torng, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/590,945

(22) Filed: Nov. 17, 2009

(51) Int. Cl.
*H01L 21/4763* (2006.01)

(52) U.S. Cl. ............ 438/622; 438/3; 438/614; 438/618; 438/620; 438/674; 257/E21.665

(58) Field of Classification Search .................. None
See application file for complete search history.

(56) References Cited

U.S. PATENT DOCUMENTS

| | | | |
|---|---|---|---|
| 6,806,096 B1 | 10/2004 | Kim et al. | |
| 6,849,465 B2 | 2/2005 | Park et al. | |
| 7,122,386 B1 * | 10/2006 | Torng et al. | ........ 438/3 |
| 7,508,700 B2 | 3/2009 | Zhong et al. | |
| 2008/0296711 A1 | 12/2008 | Kyler et al. | |

* cited by examiner

*Primary Examiner* — N Drew Richards
*Assistant Examiner* — Kyoung Lee
(74) *Attorney, Agent, or Firm* — Saile Ackerman LLC; Stephen B. Ackerman

(57) ABSTRACT

Described herein are novel, cost effective and scalable methods for integrating a CMOS level with a memory cell level to form a field induced MRAM device. The memory portion of the device includes N parallel word lines, which may be clad, overlaid by M parallel bit lines orthogonal to the word lines and individual patterned memory cells formed on previously patterned electrodes at the N×M intersections of the two sets of lines. The memory portion is integrated with a CMOS level and the connection between levels is facilitated by the formation of interconnecting vias between the N×M electrodes and corresponding pads in the CMOS level and by word line connection pads in the memory device level and corresponding metal pads in the CMOS level. Of particular importance are process steps that replace single damascene formations by dual damascene formations, different process steps for the formation of clad and unclad word lines and the formation of patterned electrodes for the memory cells prior to the patterning of the cells themselves.

28 Claims, 11 Drawing Sheets

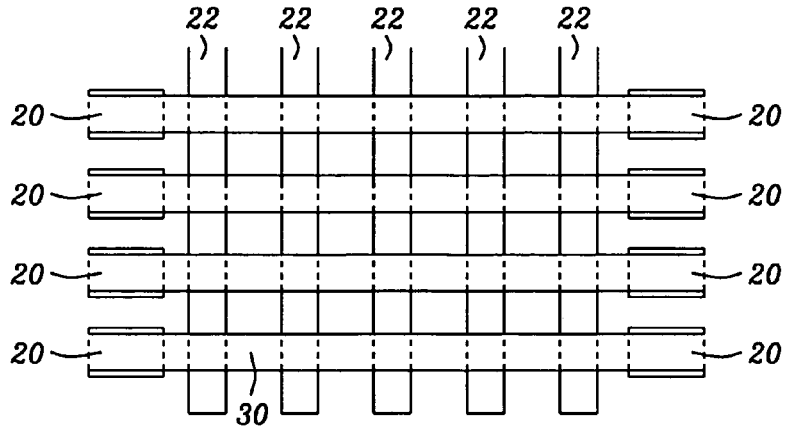
FIG. 1a – Prior Art
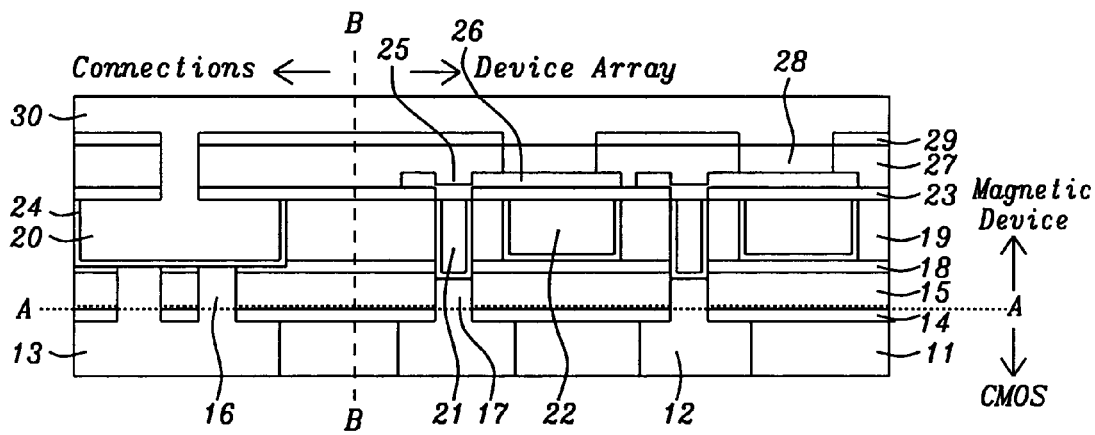
FIG. 1b – Prior Art
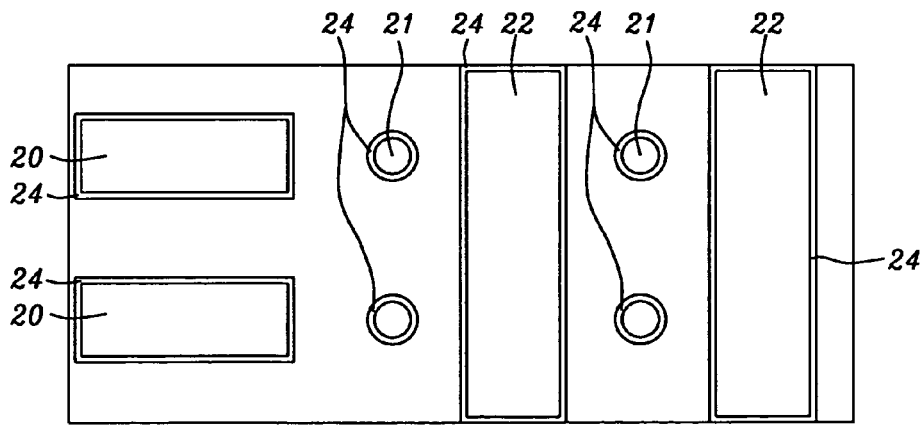
FIG. 2 – Prior Art

METHOD OF HIGH DENSITY FIELD INDUCED MRAM PROCESS

BACKGROUND OF THE INVENTION

1. Field of the Invention

This invention relates generally to the fabrication of high density MRAM arrays. In particular, it relates to process integration schemes that can improve the scalability of high density field induced MRAM arrays.

2. Description of the Related Art

MRAM (Magnetic Random Access Memory) is now a proven memory technology that possesses many advantages over competing technologies. The main concerns associated with MRAM technology are its scalability and cost competitiveness.

In its basic form, MRAM circuitry incorporates an MTJ (magnetic tunnel junction) cell as a memory storage device. An elementary implementation of an MTJ cell comprises two magnetized layers separated by an insulating layer. The relative directions of the magnetization of the two layers can be changed by an external magnetic field (hence the term, "field induced") of the proper direction and magnitude. When such a magnetization change occurs it produces a corresponding resistance change in the cell. This can be detected as a variation in a voltage across the cell which, in turn, is interpreted as a change in the memory state of the cell. In a typical cell configuration in which the magnetization of one cell layer is fixed in space (pinned layer) while the other is free to move (free layer), the two possible relative directions of two magnetized layers are parallel and antiparallel, which create, respectively, low and high resistance states of the cell and are then interpreted as a zero and one in binary logic.

To form an MRAM device, a plurality of such MTJ cells are arrayed within an architecture whose design places individual MTJ cells in a regular two-dimensional array arranged in rows and columns. This cell array is coordinated with an adjacent orthogonal planar matrix of current carrying lines (see FIG. 1a, below) that is formed as two overlapping sets of parallel conducting lines, each set being orthogonal to the other and each set being vertically displaced from the other. These layers of lines are termed word lines and bit lines and the MTJ cells are typically located at their (vertically separated) points of intersection. Thus, when a particular pair of overlapping word and bit lines are carrying an electrical current of the proper magnitude, the MTJ cell located at their point of intersection is sufficiently perturbed by their magnetic fields to change the relative direction of its magnetization. To facilitate operation of the circuitry, the bit lines typically make electrical contact with an upper capping layer of the MTJ cell, while the word line makes contact with a conducting electrode (bottom electrode) that contacts the bottom of the MTJ cell. Thus, these lines not only activate the cells through their magnetic fields, but they are also used to implement voltage measurements across the cells.

FIG. 1a is a simplified schematic overhead illustration showing orthogonally overlapping word (22) and bit (30) lines at whose intersections MTJ cells (not shown) would be positioned. Five word lines and four bit lines are shown, forming a 4×5 array, but an actual N×M array would more typically have N (number of bit lines) between 32 and 98 and M (number of word lines) between 256 and 1024. At the terminal ends of each bit line, word line landing (or connecting) pads (20) are formed, which will be used to facilitate electrical connections between the word and bit lines. As will be shown in FIG. 1b below, in a side cross-sectional view of one end of an exemplary illustrative circuit, the bit lines (30) are formed above the word lines (22) and the landing pads (20) are below the bit lines.

The physical layout of this typical MRAM device architecture comprises two vertically separated but electrically interconnected levels of circuitry. An upper level contains the MTJ cells and associated orthogonal matrix of current carrying word and bit lines substantially as schematically illustrated in FIG. 1a. The lower level contains an integrated CMOS based circuit that provides access to particular cells in the upper level for memory storage and read-out purposes by allowing current to flow into the selected wires in the matrix as well as into electrodes that directly connect to MTJ cells. As we shall see, the prior art process integration schemes by which these levels are fabricated and interconnected can be made more efficient so that the manufacturing costs are reduced and circuit scalability is improved.

Referring now to FIG. 1b, there is shown a schematic side cross-sectional illustration of an exemplary prior art MRAM device that includes a lower CMOS level and an upper magnetic memory device level that, in this example, is based on an array of MTJ cells and the word and bit line formation of FIG. 1a. The memory level could be a level formed of other active devices than MTJ cells. It will be an object of the present invention to describe new process steps and to apply them to the fabrication of this device, specifically to the integration of the CMOS level with the magnetic device level, possibly with slight variations in form that will be described. FIG. 1b will show the device from a side view and identify its component parts. FIG. 2 will show an overhead view of the same device at a horizontal cross-sectional level. Following this, FIG. 3a-3g will describe the prior art process steps by which this device is fabricated. Reference will be frequently made to the formation of various current carrying elements in a "single damascene" or a "dual damascene" process. This is a method of forming patterned metal conducting lines or vias in dielectric layers that is well known in the art, wherein trenches are formed in the layer or layers at either a "single" depth or at two different, or, "dual" depths and a conducting metal layer is deposited within the trench. The trench may be clad (lined) with a diffusion barrier prior to the metal layer deposition, or the trench may be left unclad. Note also that, for ease of visualization, all of the figures show only a small section of what would be a large device array substantially symmetrically disposed in a horizontal plane. It is understood by those familiar with the art that, generally, although only two word lines will be shown in these illustrations, there would be a plurality of M parallel word lines (M between 256 and 1024). It is also known that although only one bit line will be shown, there would be a plurality of N parallel bit lines (N between 32 and 98), directed orthogonally to the M word lines. The M word line connection pads (20) shown located at the opposite ends of each bit line will essentially define the lateral extent of the fabrication.

A 4×5 array has been shown in FIG. 1a. It is also known that although only two MTJ devices will be shown, there would be a regular N×M array of such devices, with one device being formed at each intersection of a word line and a bit line. Similarly, although only one or two connecting vias will be shown, there would be as many vias as necessary to form similar connections to all word lines, bit lines, MTJ devices and interconnects within the CMOS level.

The device in FIG. 1b has been nominally subdivided into four regions, solely for purposes of visualization. The horizontal broken line, A, subdivides the device into an upper "magnetic device portion" and a lower CMOS level. The vertical broken line, B, divides the device into a portion called "device array," which, in this example, includes the MTJ cells and connections leading to them, and a portion called "connections," which contains vertical conductive connections (vias) between CMOS level conducting lines and magnetic device level bit lines.

The CMOS level contains dielectric layers (11), and conducting pads (12), (13) surrounded by the various structures that will allow current to be carried upward from the CMOS level to elements in the magnetic device level. Typically the conducting connecting pads (12), (13) have been formed in a Cu damascene process into trenches within a dielectric layer (11). Conducting pad (12) is a metal landing pad for providing convenient connections to MTJ devices, while conducting pad (13) is a word line landing pad for contacting conducting vias (16) that will ultimately connect word lines and bit lines.

A dielectric capping layer (14) forms the boundary between the CMOS level and the magnetic device level. Regions (15) are portions of a dielectric layer through which vias (16), (17) have been formed. Vias (16) will connect the landing pads (13) in the CMOS level to a word line layer connection landing pad (20) and thereafter through to a bit line (30). Unclad vias (17) will be extended upward through clad via (21) and will finally connect the bottom electrodes (26) of the MTJ cells at opening (25) to CMOS level landing pads (12).

A dielectric capping layer (18) forms a floor for the formation of word lines (22). The word lines have been clad (24) in a damascene process. The same damascene process and the cladding have also been used in forming word line connection vias (21) and word line layer metal landing pads (20). We shall see below, that the addition of cladding (24) may be necessary for the word lines (22), but not for the vias (21) and connection pad (20).

A dielectric layer (23) separates the word line layer from the MTJ cells (28) and the bottom electrodes (26) on which the MTJ cells are formed. Finally a dielectric layer (29) serves as a substrate on which to form the bit line (30), which is formed in a damascene process. A via (31) connects the bit line to the landing pad (20).

Referring to FIG. 2, there is shown, to clarify the geometry, a schematic overhead view of a horizontal cross-section through an intermediate level of the fabrication shown in the side view in FIG. 1*b*. The structures (20) are word line layer connection metal landing pads (see also (20) in FIG. 1*a*) that will be used to facilitate connections between the word line (22) and bit line (not shown in FIG. 2, but see (30) in FIG. 1*a*). The circular openings (21) are clad connection vias. The thin layers (24), surrounding (20), (21) and (22) are cladding layers formed during the Cu damascene WL construction.

In the following description, using FIGS. 3*a*-3*g*, we illustrate the process steps by which the prior art MRAM device of FIG. 1*b* is fabricated. These steps will allow us to point to the inefficiencies and disadvantages of the prior art methodology and will lay a foundation for us to more meaningfully describe the objects of the present invention and the methods and structures required to implement it. For simplicity, we begin our process flow using the metal level of an already fabricated CMOS substructure as a substrate on which to fabricate the MTJ memory level. By "metal level" we refer to the patterned and Cu damascened structure of lines and connections shown below line A in FIG. 1. The structures in this level are already connected to CMOS devices below (not shown) and it is these devices that will ultimately be interconnected with the MTJ memory level to be formed above.

Referring first to schematic FIG. 3*a*, there is shown an already fabricated layer of CMOS patterned metal (12), (13), typically formed in a Cu damascened configuration. In accord with a single Cu damascened formation, Cu (the metal) is deposited in patterned and etched dielectric insulation (11) and excess metal extending beyond the etched regions of the dielectric is removed by a CMP process. The resulting planar (and metal-free) surface is covered with a first thin dielectric/capping/etch-stop layer (14). The patterned metal includes conducting lines and interconnects. Everything below layer (14) can be thought of as the CMOS level, although the actual CMOS structures will not be illustrated. The MTJ memory level will be formed above layer (14). A blanketing dielectric layer (15) has been formed over the capping layer (14) which will serve as a surrounding medium for the MTJ fabrications and their write lines and bit lines.

Referring next to schematic FIG. 3*b*, there is shown the formation of interconnecting vias (16), (17) through the single blanket layer (15) using a single Cu damascene process that is well known in the art. The vias (17) will then be extended to go between the lower CMOS level and the upper MTJ level, The fabrication is then covered by a second thin capping layer (18) and a second blanketing dielectric layer (19). It is important to note that excess Cu must be removed by a CMP process to allow deposition of the second capping layer (18).

Referring next to schematic FIG. 3*c*, there is shown the application of a single Cu damascene process to create word lines (WL) (22) and word line connection metal landing pads (20) to connect the word line (WL) and the bit line (BIT), word line connection (WLC). The vias (21), which are clad (24), extend upward from vias (17) and now connect CMOS and individual MTJ devices. Typically, the word line (WL) (22) and word line connection (WLC) via (21) are formed and clad at the same time using a single mask. Therefore both the WL and the WLC have cladding materials, which are shown as (24). We shall see with respect to the second, third and fourth embodiments below, that the unnecessary cladding of the via (21) is eliminated by the use of two masking processes in a double damascene process. Elimination of unnecessary cladding materials is highly advantageous as structures continue to diminish in size, as these cladding materials can interfere with the magnetic properties of the devices that are nearby.

Referring next to schematic FIG. 3*d*, there is shown the fabrication of FIG. 3*c* with the formation of a third capping layer (23) which is opened at (25) to complete the interconnecting vias (17) and (21) through which the connections between subsequent bottom electrodes (BE) of MTJ cells and CMOS devices will be made.

Referring next to schematic FIG. 3*e*, there is shown the fabrication of FIG. 3*d* with the deposition of a bottom electrode (BE) layer (26) on which is then formed and patterned MTJ cells (28). Typically, the BE and the MTJ are formed in a single pump-down deposition process. Then the MTJ is patterned. After MTJ patterning, a dielectric protection layer (260) is deposited and this is followed by the BE patterning which is done by the use of a photomask and etch process.

Referring next to schematic FIG. 3*f*, there is shown the results of patterning the BE layer (26) of FIG. 3*e*, followed by the deposition of a blanketing dielectric refill layer (27) to isolate MTJ cells. The refill layer (27), which subsumes the protective layer (260) of FIG. 3*e*, is then planarized by a process of chemical mechanical polishing (CMP), leaving a smooth and planar upper surface.

Referring finally to schematic FIG. 3*g*, there is shown the fabrication of FIG. 1*f* on which a fourth protective dielectric layer (29) for bit line deposition by a double damascene process has been deposited. A via (31) is formed through (29), (27) and the third dielectric capping layer (23). This via will connect the word line connection pad (20) to the BIT line about to be formed. Additional openings in (29) have been made over the MTJ cells (28). Finally, a BIT line (30), using a dual damascene process, is formed over the entire fabrication. The lower surface of the BIT line contacts via (31) to enable a connection to the word lines.

The steps outlined above and described in FIGS. 3a-3g can be changed and the resulting process flow can be made more efficient, cost effective and scalable by addressing certain issues related to the damascene process that requires the cladding of lines and vias. Prior art attempts have already been disclosed in efforts to address some of the issues associated with MRAM fabrication. Kim et al. (U.S. Pat. No. 6,806,096) discloses a dual damascene process to pattern conductive lines and vias in an MRAM. Zhong et al. (U.S. Pat. No. 7,508,700) assigned to the same assignees as the present invention, discloses a dual damascene process to form vias and bit line contact pads. Park et al. (U.S. Pat. No. 6,849,465) teaches patterning a bottom electrode prior to depositing the soft magnetic layer of the MTJ. Kyler et al. (US Publ. Patent Appl. 2008/0296711) teaches forming a bottom electrode prior to forming the MTJ stack.

Although this prior art does describe certain elements of an MRAM fabrication, it does not teach methods that address the fabrication process steps as a whole so as to make the process flow simpler, more efficient and more readily scalable. That is the intent of the present invention.

SUMMARY OF THE INVENTION

A first object of this invention is to provide an improved integration scheme for fabricating high density field MRAM devices.

A second object of this invention is to provide a more efficient and cost effective technique for the formation of interconnections between a CMOS level and a memory device level in an MRAM device when word line cladding is not required.

A third object of this invention is to provide an improved method of forming dual damascene pad connections when it is required to form word lines using a dual damascene process.

A fourth object of this invention is to provide an improved process flow for the formation of MRAM devices that will result an improved scalability of field induced MRAM.

These objects will be met by a new MRAM fabrication process which can be particularly advantageously implemented when word line cladding is not required. Alternative methods are then presented for use when cladding is required, but the advantages of these methods will accrue particularly as the size of circuit elements continue to decrease. One method (First Embodiment) is presented for implementation when word line cladding is not required. Three alternative fabrication processes (Second, Third and Fourth Embodiments) can be advantageously implemented when word line cladding is required. These processes are described briefly as follows:

1. When word line cladding is not required, the present invention combines a single damascene Cu CMP of a word line with a single damascene Cu CMP of a via into a dual damascene Cu CMP process to simplify the process flow, and reduce the cost.

2. When word line cladding is required, an alternative form of the present invention uses a double patterning technique to form those vias that are close to MTJ cells within a separate masking step. Within this separate step no cladding materials are used in the vias, so subsequent interference between cladding materials and the magnetic cell can be avoided. Such interference between cladding materials and magnetic elements become particularly troublesome as the size of the elements become increasingly small, so the method is of particular benefit as circuitry decreases in size.

3. In the prior art, MTJ cells are patterned first and bottom electrodes are patterned second. In this invention, the bottom electrodes (BE) are formed and patterned and planarized first, then a refill dielectric is formed around the BE layer and planarized, then the MTJ cells are formed over the refill layer and patterned. Prior patterning of the BE metal layer eliminates portions of the BE metal that extend beyond the MTJ cells in the prior art process. This approach significantly reduces the CD and overlay budget for the BE and MTJ and, therefore, improves the scalability of field MRAM.

These processes are advantageous when applied individually in the course of fabricating a memory device or in the course of fabricating other device structures in which lines and vias or similar elements coexist within the same or adjacent levels. These processes are clearly advantageous when applied to the particular fabrications used as examples in the four embodiments described below. In the process implementations to be described in detail below, the width of the word lines is between approximately 0.2 and 0.5 microns and its depth is between approximately 0.1 microns and 1.0 microns, the width of a bit line is between approximately 0.2 and 0.5 microns and its depth is between approximately 0.1 microns and 1.0 microns and the lateral dimensions of an MTJ cell is between approximately 0.2 and 0.5 microns.

BRIEF DESCRIPTION OF THE DRAWINGS

FIG. 1a is a schematic overhead view showing a simplified orthogonal array of 4 bit lines and 5 word lines with connecting pads formed adjacent to the ends of the bit lines.

FIG. 1b is a schematic illustration of an exemplary prior art MRAM device of a type that uses the orthogonal array of FIG. 1a and whose fabrication will be improved by the methods of the present invention.

FIG. 2 is an overhead view of a particular horizontal level of the prior art fabrication shown in FIG. 1b. It is shown to indicate details of a portion of the 2-dimensional layout structure.

DESCRIPTION OF THE PREFERRED EMBODIMENTS

The four embodiments of the present invention described below are each a fabrication process flow for an MRAM device in which an MTJ (or other field induced type) memory cell level is to be integrated with a CMOS level. The MTJ cell is used as a memory storage unit and the CMOS elements provide access to the cells for read/write purposes. Each memory cell lies at the junction of a vertically separated word line and a bit line. These lines are also activated by the CMOS devices which send current to the proper lines that will create the combined magnetic fields at the position of a memory cell and write on the cell by changing the direction of its magnetization. However, the methods disclosed in these embodiments can equally well be applied to the integration of other active elements with a level of CMOS structure. In addition, the following embodiments are described with reference in the illustrations to only a particular portion of an MRAM circuit. This portion is exemplary only and its use is to simplify the visualization of the process. It should be understood that, in practice, the methods of this invention will be applied to the fabrication of an entire N×M array of cells (M parallel word lines, overlaid by N parallel bit lines that are orthogonal to the word lines). Equally, the methods of these embodiments can be applied to the formation of a single cell at the intersection of a single word line and bit line.

In a first embodiment, the invention is directed at improving the efficiency, cost effectiveness and scalability of a fabrication process flow in which cladding of word lines is not required. In the second, third and fourth embodiments a process flow will be described that has its greatest advantages when circuit sizes decrease and the word lines are to be clad.

First Embodiment

Figure 4A:
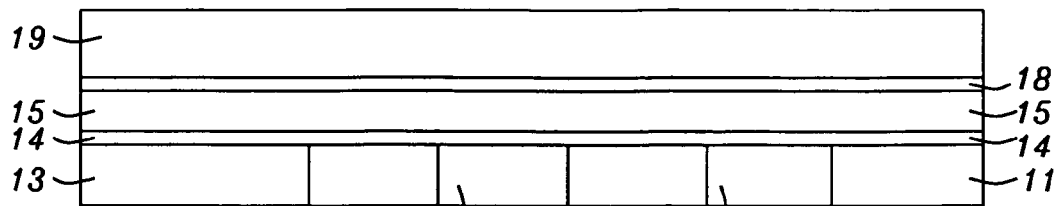
FIG. 4a to FIG. 4g are schematic side view cross-sectional drawings showing a sequence of process steps that will implement a first embodiment of the present invention.

Referring first to schematic FIG. 4a, there is shown a "last layer" of CMOS circuitry (i.e. a layer immediately below dashed line A in FIG. 1b). This layer includes layers of metal (eg. conducting layers of Cu) (12), (13), separated by the dielectric insulation (11) in which they are formed (eg. in damascene type structures). In each of the embodiments described below, the MTJ memory level is assumed to be formed on precisely this "last" CMOS layer, which is an upper layer of conducting lines and interconnections that will be connected to the MTJ cell level. The various structures that lay within the unseen CMOS layers beneath this last layer includes CMOS devices such as transistors that access particular MTJ cells in the memory level above. As far as the MTJ level is concerned, however, it is the interconnections to the last layer that communicate with the remainder of the CMOS circuitry.

The last layer is covered with a first thin capping/etch stop layer (14) formed of SiN, SiNC or other appropriate material. It is to be noted that the dielectric materials such as (11) in the CMOS layer are normally low k materials (low dielectric constant) which tend to have less mechanical strength than the more usual $SiO_2$ dielectrics used in the remainder of the fabrication. Because they have less mechanical strength, these low k dielectrics are prone to crack during the CMP processes used to planarize the CMOS level. For this reason, capping layer (14) serves a dual role of adding mechanical strength to the CMOS layer as well as being an etch-stop layer during patterning processes. Capping layer (14) is typically a layer of SiCN, formed to a thickness between approximately 300 and 1500 angstroms.

Everything below layer (14) can be thought of as the CMOS level, although the actual CMOS structures will not be illustrated. The MTJ memory level will be formed above layer (14). It is to be noted, that unless stated expressly otherwise, all etch stop layers, except possibly layer (14), in the following embodiments will be layers of SiN or similar material formed to a thickness between approximately 300 and 1500 angstroms.

Figure 3A:
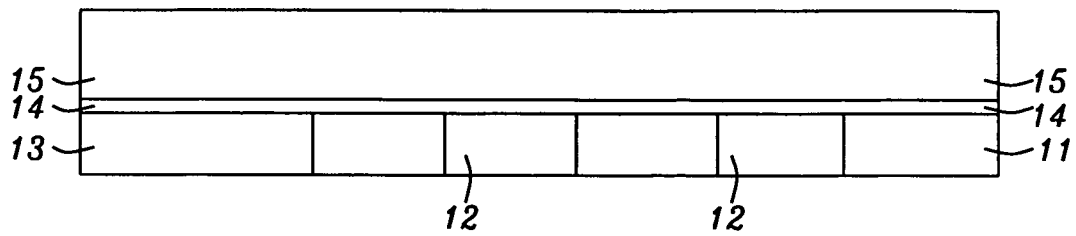
FIG. 3a to FIG. 3g are schematic side view cross-sectional drawings showing a sequence of process steps (a process flow) that is implemented during the fabrication of the prior art MRAM device of FIG. 1.
Figure 3B:
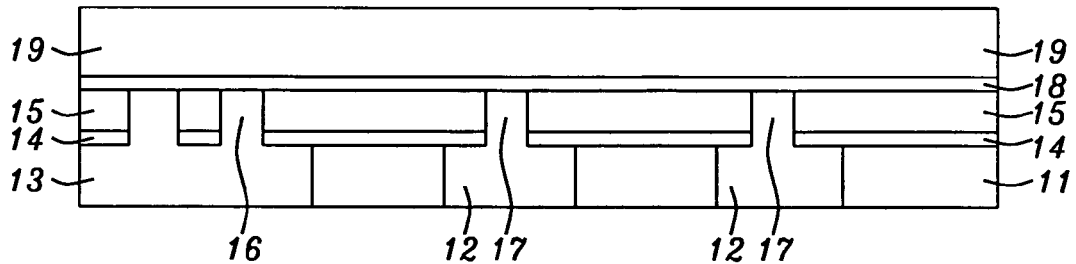

A first blanketing dielectric layer (15) has been formed over the etch stop layer (14). A second etch stop layer (18), similar in material and dimension is formed on dielectric layer (15). A second blanketing dielectric layer (19) is formed on etch stop layer (18). The layers (14), (15), (18) and (19) will provide the substrate in which the dual damascene system of word lines and word line connecting pads will be formed. It is to be noted that etch-stop layer (18) has already been formed on dielectric layer (15) in this embodiment, whereas in FIG. 3b of the prior art scheme, the upper surface of layer (15) had to be cleared of deposited metal by a CMP process before etch-stop layer could be formed.

Figure 4B:
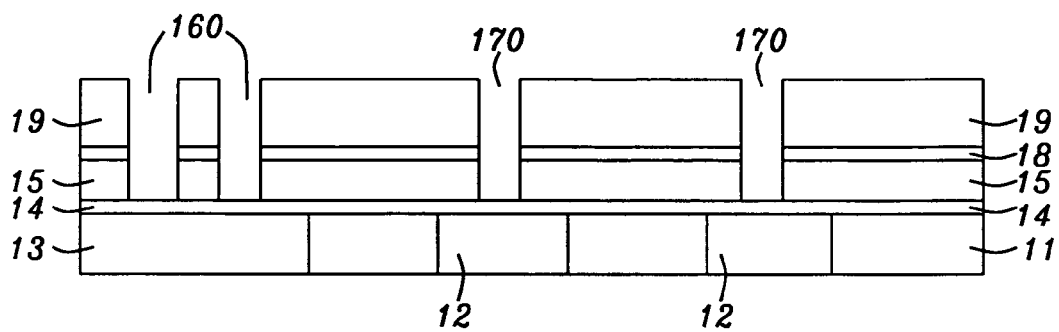

Referring next to schematic FIG. 4b, there is shown the formation (by a first patterning and etching process) of openings for interconnecting vias (a pair (160) being shown here), (170) between the lower CMOS level and the upper MTJ level. Via opening (170) will be filled with a conductor and ultimately provide a connection to the MTJ cell and via openings for the pair shown as (160) will be filled to provide a connection to the word line connection pad shown as (20) in the following figure. These lines of vias will be formed substantially along the lateral edges of the CMOS level.

Capping layer (14) serves as an etch stop layer for this etching process. In the general case of forming an M×N array of MTJ cells, there would be M×N vias (170) formed to allow connection to each of the corresponding MTJ cells. In addition, because connection pads (see (20) in FIG. 1a and in FIG. 4d) are formed at each of the two opposite ends of the N bit lines, so N uniformly spaced vias (160) or pairs of such vias will be formed along a line below each of the ends of the bit lines. As noted above, these bit line ends and the vias will be at the lateral ends of the CMOS level.

Figure 4C:
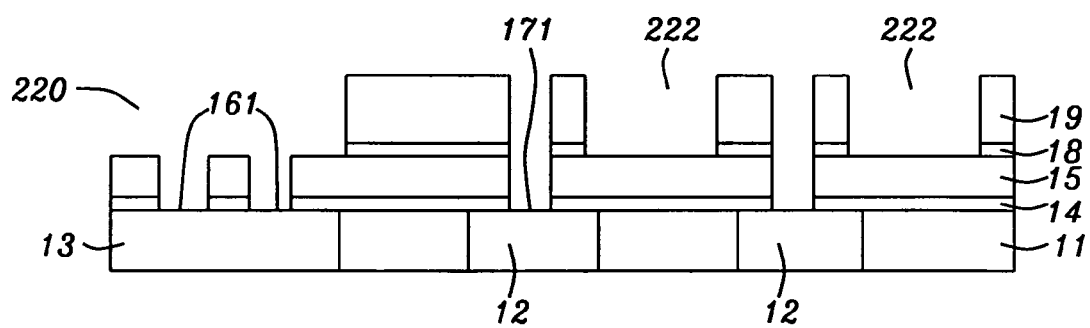

Referring next to schematic FIG. 4c, there is shown the use of a second pattern and etch process, similar to the first, to create the trench shapes (222) that will be filled to form the M word lines and trench shapes (220) that will be filled to form N word line connection landing pads (20). This etch also removes portions (161) and (171) of etch stop layer (14) that will allow electrical contact to the CMOS metal layers below. Note that (161) and (171) represent two trench levels that will be filled in a dual damascene process below.

Figure 3C:
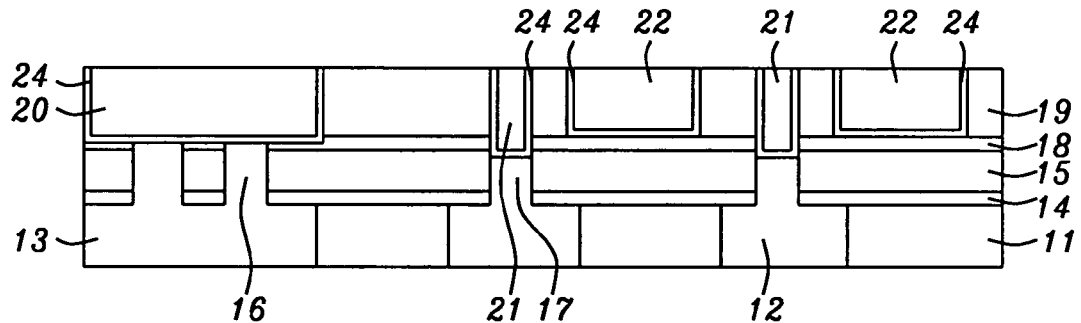
Figure 3D:
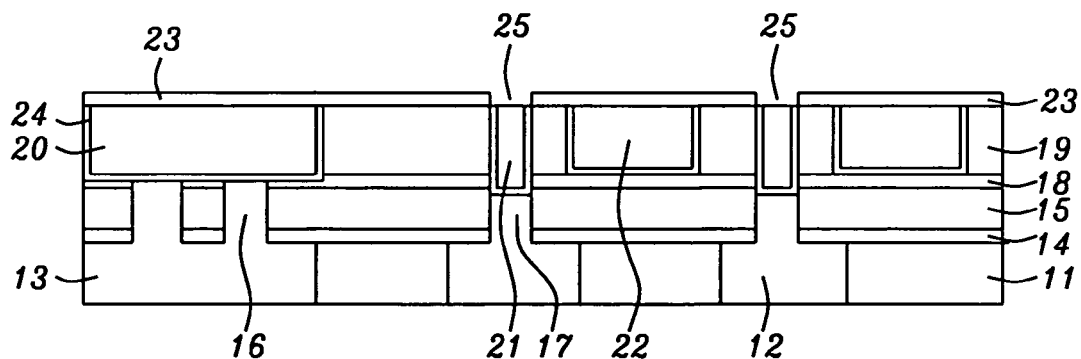
Figure 4D:
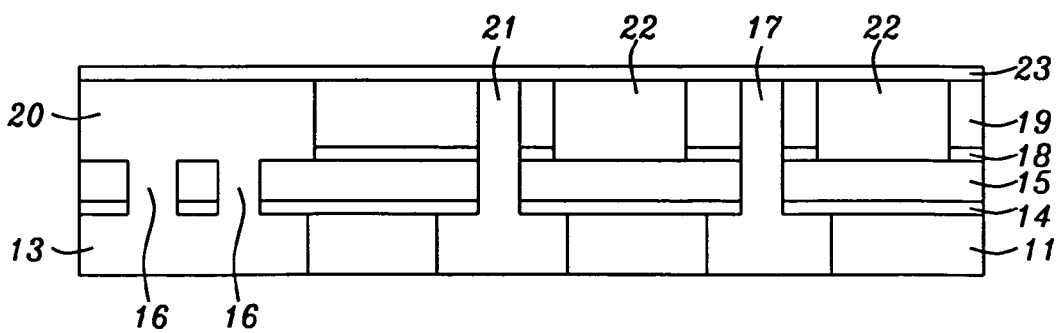

Referring next to schematic FIG. 4d, there is shown the fabrication of FIG. 4c with the results of a dual damascene process that creates the M word lines (22), the N word line pads (20) at the opposite ends of each bit line and the via connections (16) and (21) between the CMOS level and the connecting pads and MTJ cells respectively. The dual damascene process itself is well known in the art and requires a Cu plating in two levels of trenches (in this case the upper level write lines and the lower level vias) formed in dielectric layers, followed by a Cu CMP to remove excess Cu deposited about the word lines (22). An interlayer dielectric (23) of SiN or similar material has then been applied to a thickness between approximately 300 to 1500 Angstroms to cover the fabrication. It is to be noted that this double Cu damascene step advantageously replaces the two separate single Cu damascene steps described in FIG. 3b and FIG. 3c of the prior art process.

Figure 4E:
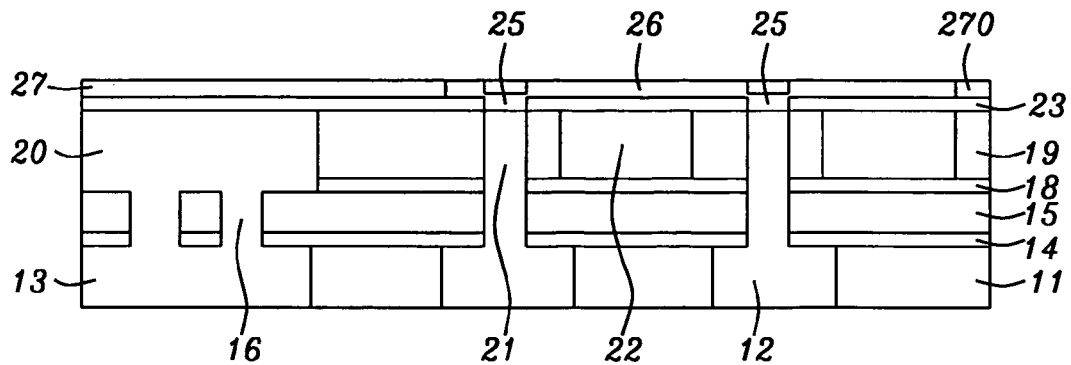

Referring next to schematic FIG. 4e, there is shown the patterning of the word line via (WLV) (25) by removing portions of (23) to open the word line connection to a bottom electrode (BE) layer (which will then be deposited). The bottom electrode (BE) layer (26) is then deposited and patterned. A dielectric refill layer (270) is deposited over the upper surface of the fabrication and planarized by a CMP process. The refill material for (270) can be $SiO_2$ with a thickness between approximately 500 and 3000 Angstroms.

Figure 3E:
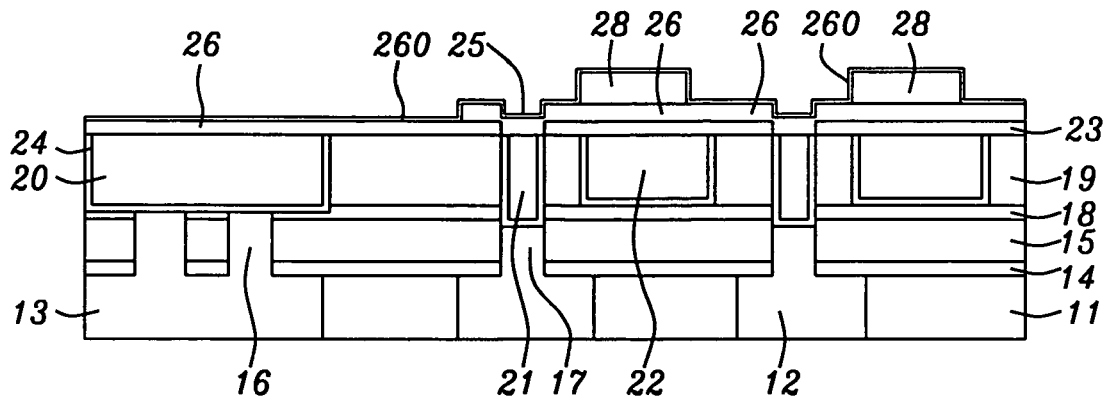
Figure 3F:
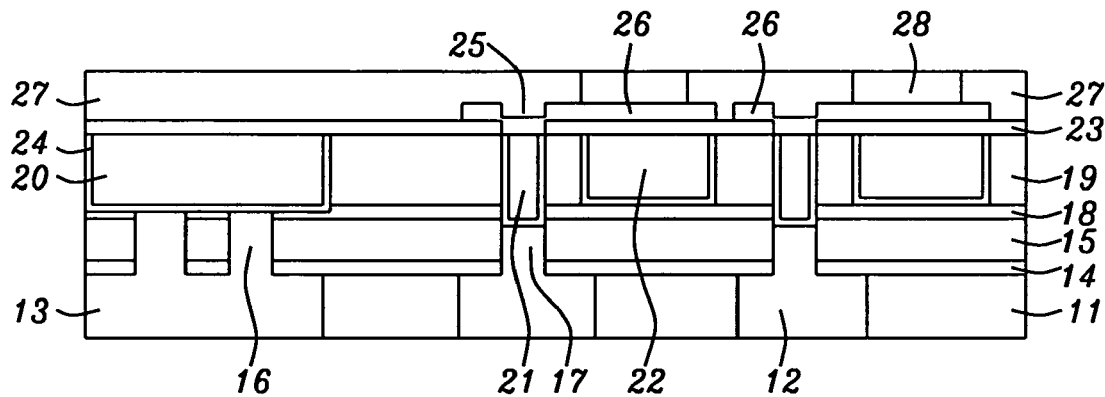
Figure 3G:
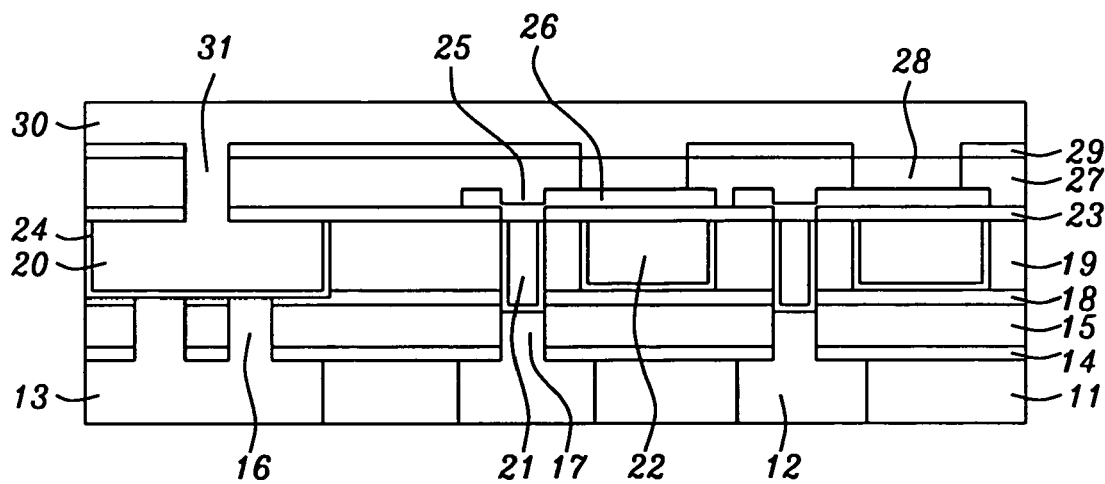

Refill layers of $SiO_2$ are found to be advantageous around magnetic materials; if other refill dielectrics are used, they would be formed to thicknesses between approximately 800 and 5000 angstroms. It is to be noted that the patterning of the BE layer at this point in the process, before deposition of the MTJ cells, is a distinct advantage over the prior art process described with reference to FIG. 3e.

Figure 4F:
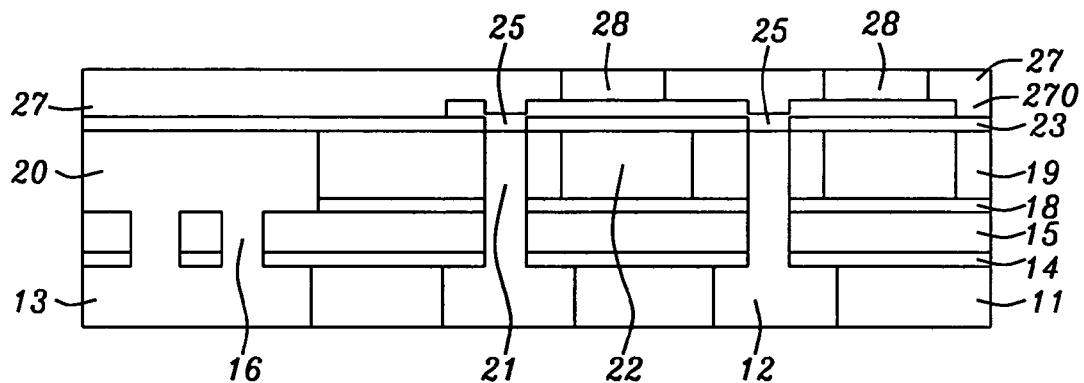

Referring next to schematic FIG. 4f, there is shown the fabrication of FIG. 4e with the results of patterning the BE layer (26), followed by the formation and patterning of the MTJ cells (28) and the deposition of a blanketing dielectric refill layer (27) to isolate MTJ cells. The refill layer (27) can be $SiO_2$ or the like formed to a thickness between approximately 800 and 5000 Angstroms. The refill layer (27) is then planarized by a process of chemical mechanical polishing (CMP), leaving a smooth and planar surface.

Figure 4G:
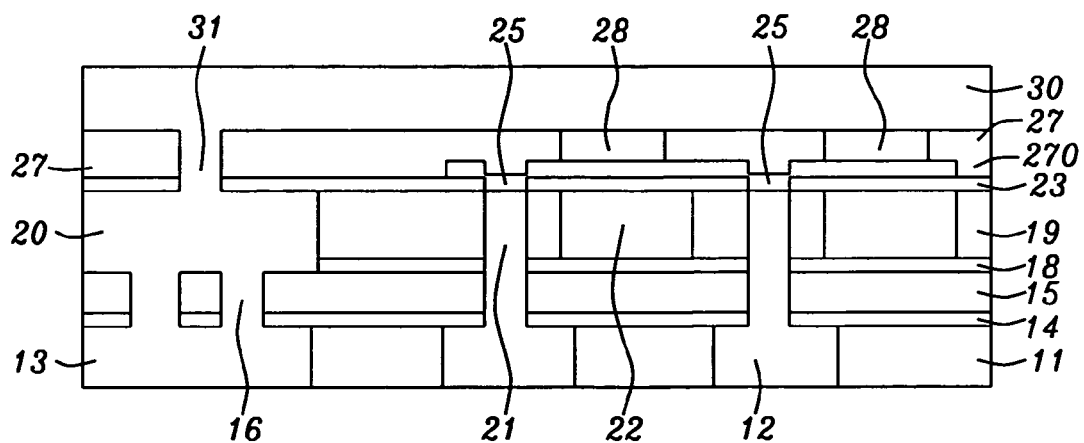

Referring finally to schematic FIG. 4g, there is shown the fabrication of FIG. 4f within which a via (31) is formed through (23) and (27) to reach the upper surface of the fabrication. A bit line (BIT) (30) is formed in a dual damascene process and the bit line contacts the via (31) which completes connection to the word line connection pad (20). The bit line also contacts the upper surfaces of the MTJ cells (26).

Second Embodiment

Referring next to the schematic sequence of FIGS. 5a-5g there will be illustrated and described a second embodiment that permits an integration scheme when word line cladding is required.

Figure 5A:
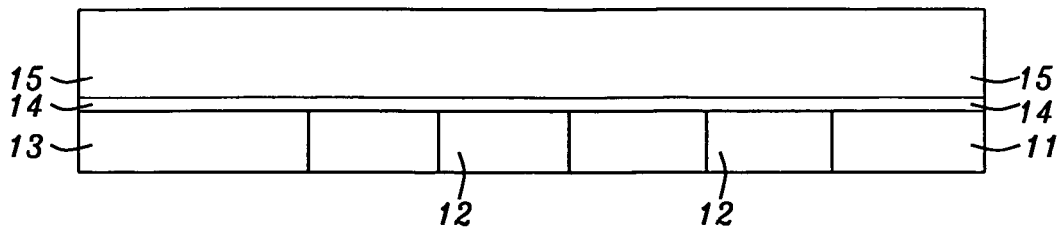
FIG. 5a to FIG. 5g are schematic side view cross-sectional drawings showing a sequence of process steps that will implement a second embodiment of the present invention.

Referring first to schematic FIG. 5a, there is shown below etch stop layer (14) an already fabricated last layer of CMOS patterned metal (12), (13), typically formed in a Cu damascened configuration. In accord with a single Cu damascened formation, Cu (the metal) is deposited in patterned and etched dielectric insulation (11) and excess metal extending beyond the etched regions of the dielectric has been removed by a CMP process. The resulting planar (and metal-free) surface is covered with a first thin dielectric/capping/etch-stop layer (14). The patterned metal below (14) includes conducting lines and interconnects. Everything below layer (14) will be considered the CMOS level, although the actual CMOS structures will not be illustrated. The MTJ memory level will be formed above layer (14). A first blanketing dielectric layer (15) has been formed over the capping layer (14) which will serve as a surrounding medium for the MTJ fabrications and their write lines and bit lines. A first dielectric blanketing layer (15) is formed on layer (14).

Figure 5B:
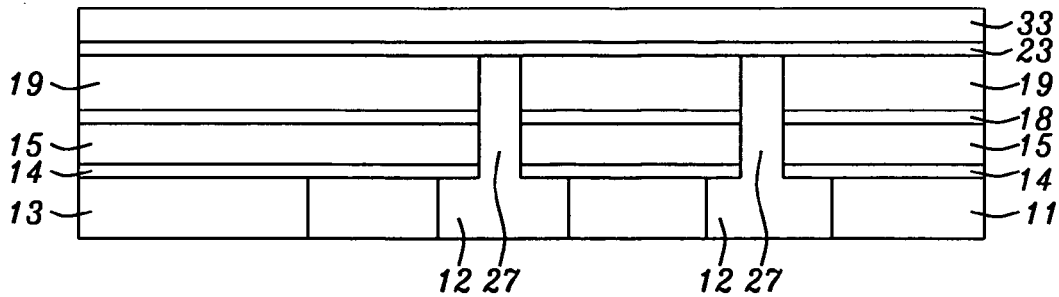

Referring next to schematic FIG. 5b, there is shown the formation of a second dielectric etch stop layer (18) on the first blanket layer (15) and a second blanket dielectric layer (19) is formed on (18). Interconnecting vias (21) are formed through two layers (15), (19) of dielectric between the lower CMOS level and the upper MTJ level, using a single Cu damascene process that is well known in the art. These vias are not clad in this process. The fabrication is then covered by either a third thin capping layer (23) or by a third blanketing dielectric layer (37). Note that both coverings are shown, but in practice only one would be used. A capping layer (23) is advantageous for preventing Cu diffusion, whereas a thicker dielectric blanketing layer (37) is preferred for CMP and etching purposes.

Figure 5C:
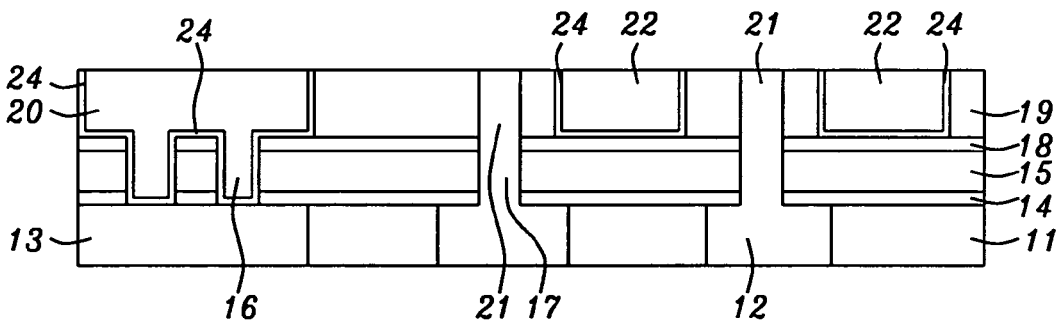

Referring next to schematic FIG. 5c, there is shown the application of a dual Cu damascene process to create word line (22) with cladding and, using a separate masking step, making word line connection metal landing pads (20) and their vias (16), also with cladding, to connect to the CMOS metal (13). The "dual" damascene process refers to the word line (22) and connecting pad (20) being on one level, while the vias (16) are on a lower level. This dual damascene process, which produces clad vias (16) but leaves vias (21) unclad, is to be distinguished from the single Cu damascene process of FIG. 3c in which the equivalent vias (16) are not clad, but vias (21) are clad. The ability to form vias with or without cladding is important because clad vias that are on the same level as word lines can have an undesirable effect on magnetic devices. On the other hand, vias that are below the word line level or far enough away from the device area, will not have an undesirable effect. Therefore, in FIG. 5c, it is advantageous to be able to form the clad word lines (22) while, at the same time leaving adjacent vias (21) unclad.

Figure 5D:
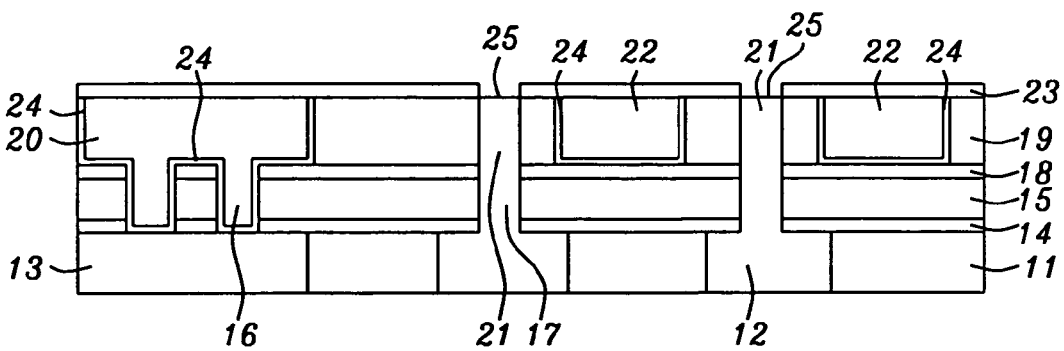

Referring next to schematic FIG. 5d, there is shown the formation of a third capping layer (23) over the just formed clad word line (22). Openings (25) are formed over the vias (21) which will form connections between subsequently formed bottom electrodes (BE) of MTJ cells and CMOS devices.

Figure 5E:
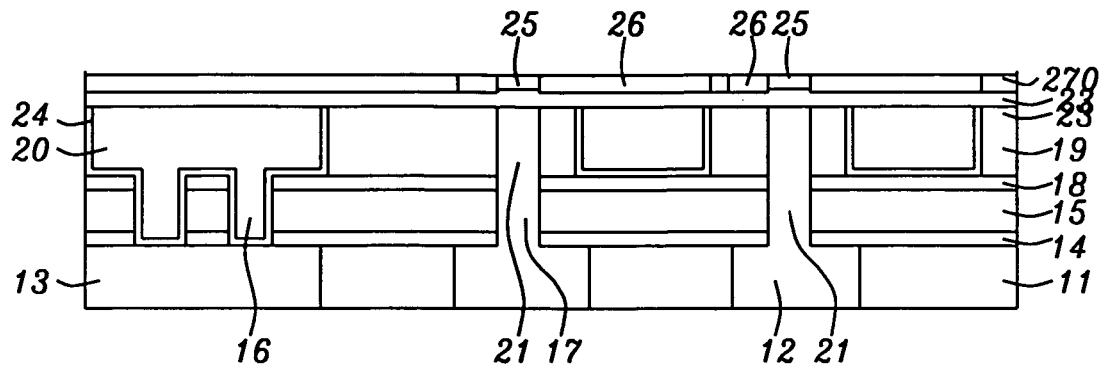

Referring next to schematic FIG. 5e, there is shown the deposition and patterning of the bottom electrode (BE) layer (26) followed by the formation of a dielectric protection layer (270) and the planarization of both the protection layer and the BE layer by a CMP process.

Figure 5F:
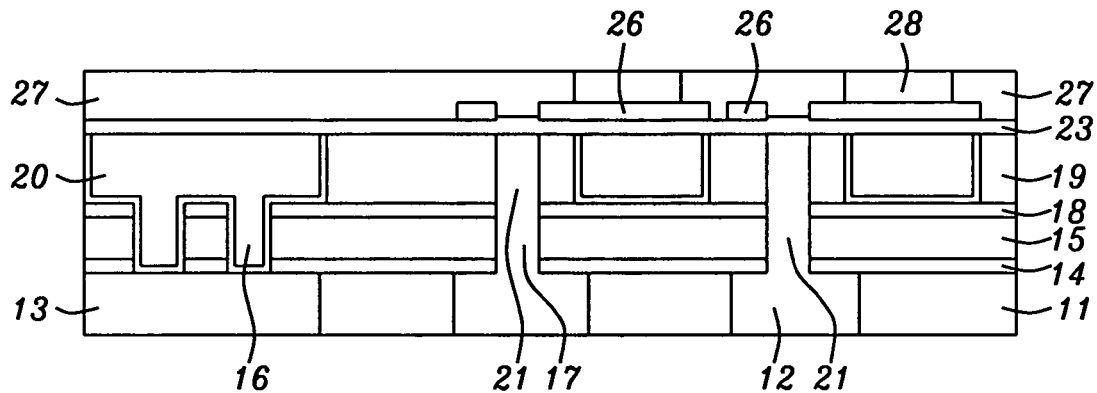

Referring next to schematic FIG. 5f there is shown the formation and patterning of MTJ cells (28). After MTJ patterning, a dielectric refill layer (27) is deposited and the layer and MTJ cells are planarized by a CMP process.

Figure 5G:
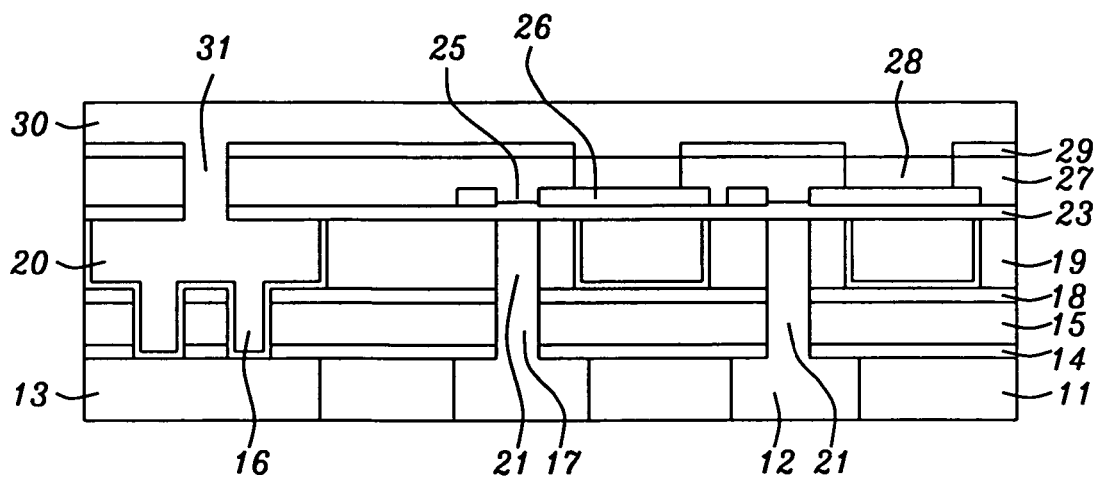

Referring finally to schematic FIG. 5g, there is shown the fabrication of FIG. 5f on which a fourth dielectric layer (29) for bit line (BIT) deposition (30) by a double Cu damascene process has been deposited. As part of the process, via (31) is formed through (29), (27) and the third dielectric capping layer (23).

Third Embodiment

Referring next to the schematic sequence of FIGS. 6a-6g there will be illustrated and described a third embodiment that permits an integration scheme when WL cladding is required.

Figure 6A:
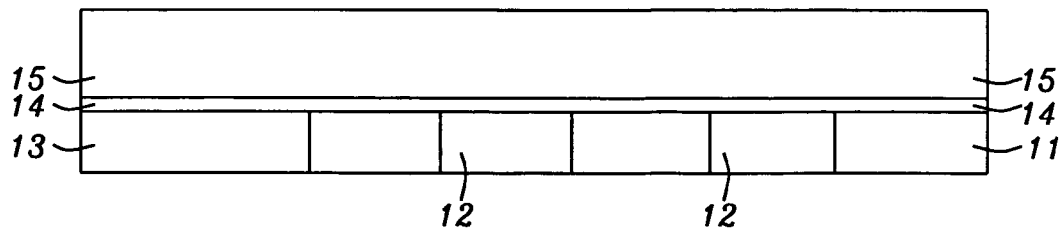
FIG. 6a to FIG. 6g are schematic side view cross-sectional drawings showing a sequence of process steps that will implement a third embodiment of the present invention.

Referring first to schematic FIG. 6a, there is shown an already fabricated last layer of CMOS patterned metal (12), (13), typically formed in a Cu damascened configuration. In accord with a single Cu damascened formation, Cu (the metal) is deposited in patterned and etched dielectric insulation (11) and excess metal extending beyond the etched regions of the dielectric has been removed by a CMP process. The resulting planar (and metal-free) surface is covered with a first thin dielectric/capping/etch-stop layer (14). The patterned metal includes conducting lines and interconnects. Everything below layer (14) can be thought of as the CMOS level, although the actual CMOS structures will not be illustrated. The MTJ memory level will be formed above layer (14). A blanketing dielectric layer (15) has been formed over the capping layer (14).

Figure 6B:
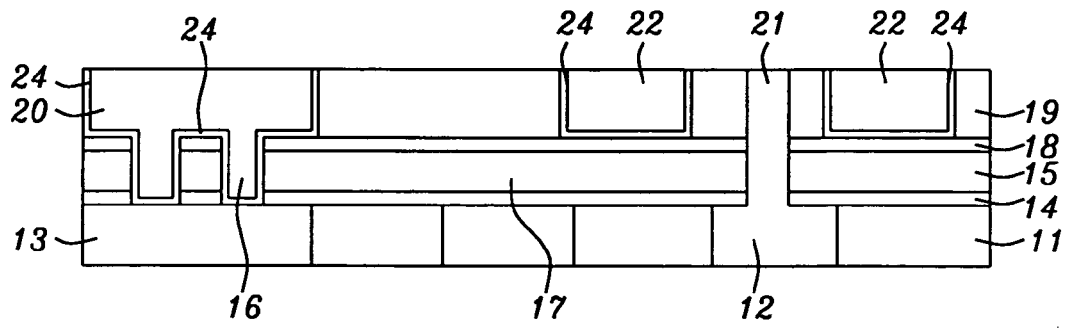

Referring next to schematic FIG. 6b, there is shown the formation on the previous fabrication of a second etch stop layer (18) and a second blanket dielectric layer (19) formed on the second etch-stop layer. Within these layers, a dual Cu damascene process is used to form clad (24) interconnecting vias (16) between the lower CMOS level (13) and a clad (24) word line pad connection (20), which is also formed within the same dual Cu damascene process. Clad word lines (22) are also formed as part of this process.

Figure 6C:
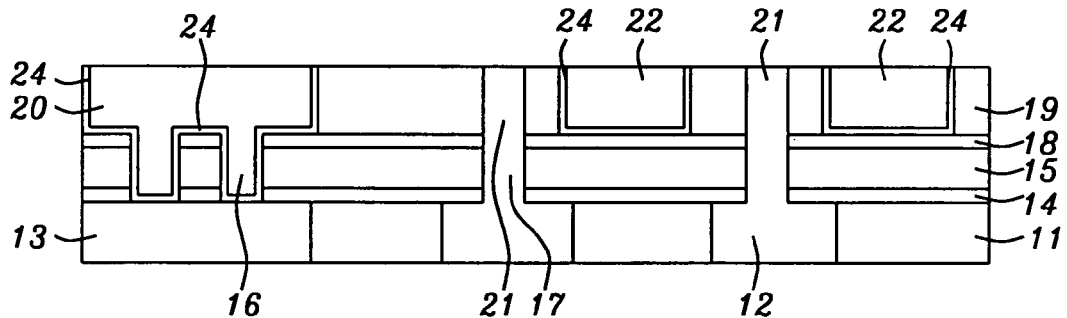

Referring next to schematic FIG. 6c, there is shown the application of a single Cu damascene process to create connection vias (21) between CMOS metal (12) and MTJ cells to be subsequently formed above the vias.

Figure 6D:
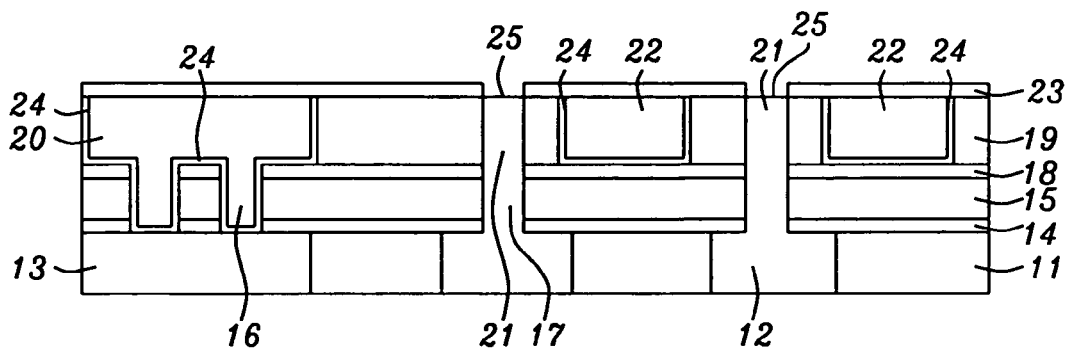

Referring next to schematic FIG. 6d, there is shown the formation of FIG. 6c on which there is the deposition of a third capping layer (23), which is opened (25) to allow connection between the vias (21) and subsequently formed bottom electrodes (BE) of MTJ cells.

Figure 6E:
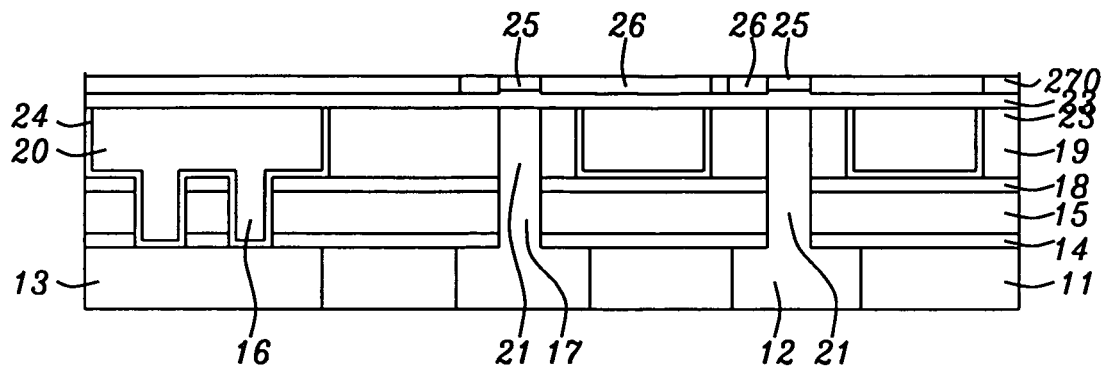

Referring next to schematic FIG. 6e, there is shown the deposition and patterning of the MTJ bottom electrode (BE) layer (26). After BE patterning, a dielectric protection layer (270) is deposited. The via (21) contacts the bottom electrode at (25). The fabrication is planarized by a CMP process.

Figure 6F:
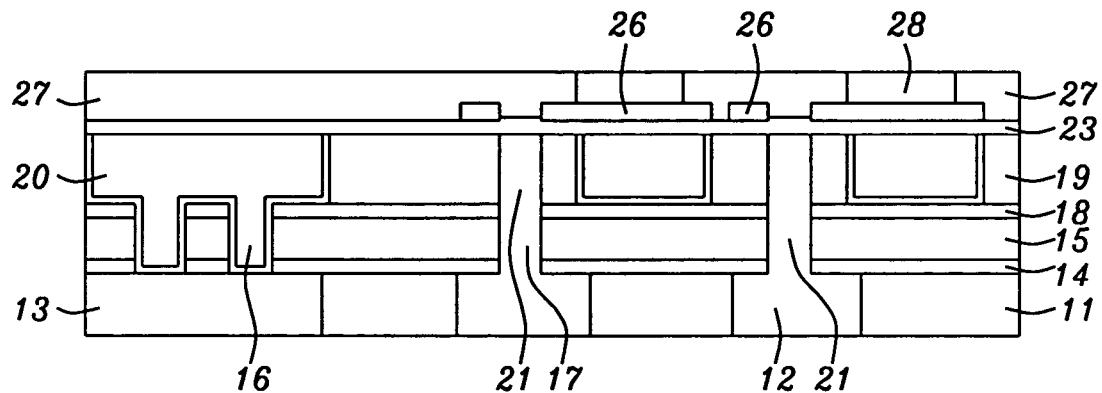

Referring next to schematic FIG. 6f, there is shown the deposition and patterning of MTJ cells (28) over the patterned BE (26). This deposition and patterning is followed by the deposition of a blanketing dielectric refill layer (27) to isolate MTJ cells. The refill layer (27) is then planarized by a process of chemical mechanical polishing (CMP), leaving a smooth and planar surface.

Figure 6G:
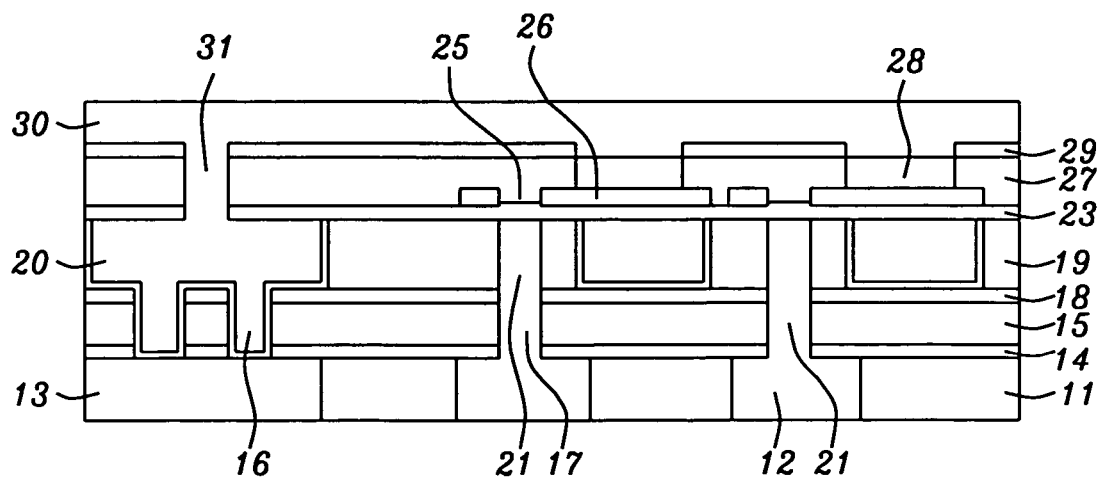

Referring finally to schematic FIG. 6g, there is shown the fabrication of FIG. 6f on which a via (31) has been opened to contact a bit line (30) that has been formed by a double damascene process.

Fourth Embodiment

Referring next to the schematic sequence of FIGS. 7a-7g there will be illustrated and described a fourth embodiment that permits an integration scheme when word line cladding is required.

Figure 7A:
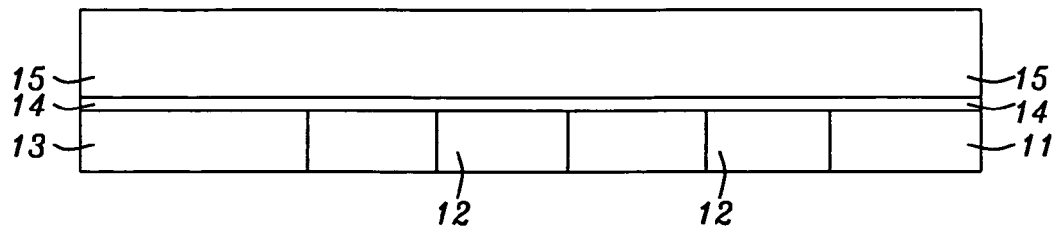
FIG. 7a to FIG. 7g are schematic side view cross-sectional drawings showing a sequence of process steps that will implement a fourth embodiment of the present invention.

Referring first to schematic FIG. 7a, there is shown an already fabricated last layer of CMOS patterned metal (12), (13), typically formed in a Cu damascened configuration. In accord with a single Cu damascened formation, Cu (the metal) is deposited in patterned and etched dielectric insulation (11) and excess metal extending beyond the etched regions of the dielectric has been removed by a CMP process. The resulting planar (and metal-free) surface is covered with a first thin dielectric/capping layer (14). The patterned metal includes conducting lines and interconnects. Everything below layer (14) can be thought of as the CMOS level, although the actual CMOS structures will not be illustrated. The MTJ memory level will be formed above layer (14). A blanketing dielectric layer (15) has been formed over the capping layer (14) which will serve as a surrounding medium for the MTJ fabrications and their write lines and bit lines.

Figure 7B:
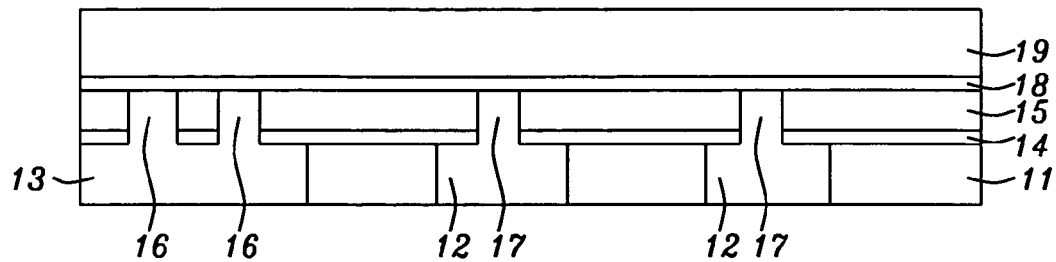

Referring next to schematic FIG. 7b, there is shown the single Cu damascene formation of interconnecting vias (16), (17) between the lower CMOS level and the upper MTJ level. The fabrication is then covered by a second thin capping layer (18) and a second blanketing dielectric layer (19).

Figure 7C:
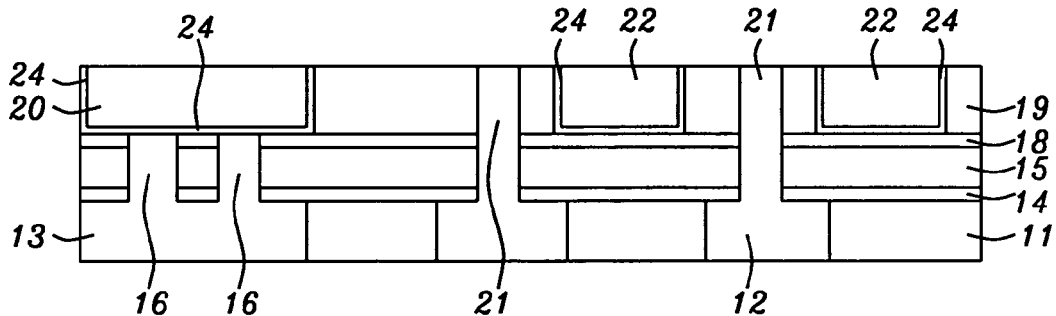

Referring next to schematic FIG. 7c, there is shown the application of a first single Cu damascene process to create a clad (24) word line (22) and a second single damascene Cu process to complete unclad vias, (17) and (21) that will ultimately connect CMOS and individual MTJ devices.

Figure 7D:
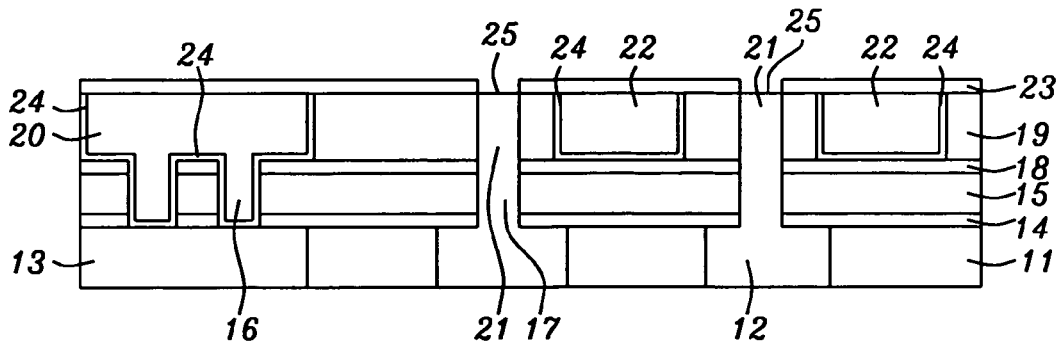

Referring next to schematic FIG. 7d, there is shown the formation of a third capping layer (23) which caps the word line (22). Openings (25) through (23) allow the via (21) to connect to subsequently formed bottom electrodes of MTJ cells.

Figure 7E:
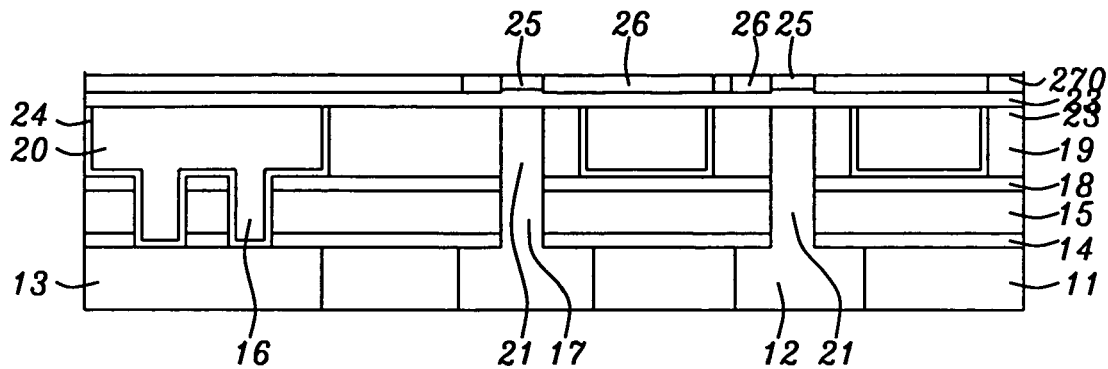

Referring next to schematic FIG. 7e, there is shown the deposition of the bottom electrode (BE) layer (26) which is then patterned by a mask and etch process, covered with a dielectric protection layer (270) and planarized by a CMP process. The via opening (25) allows a conductive connection from (21) to the BE.

Figure 7F:
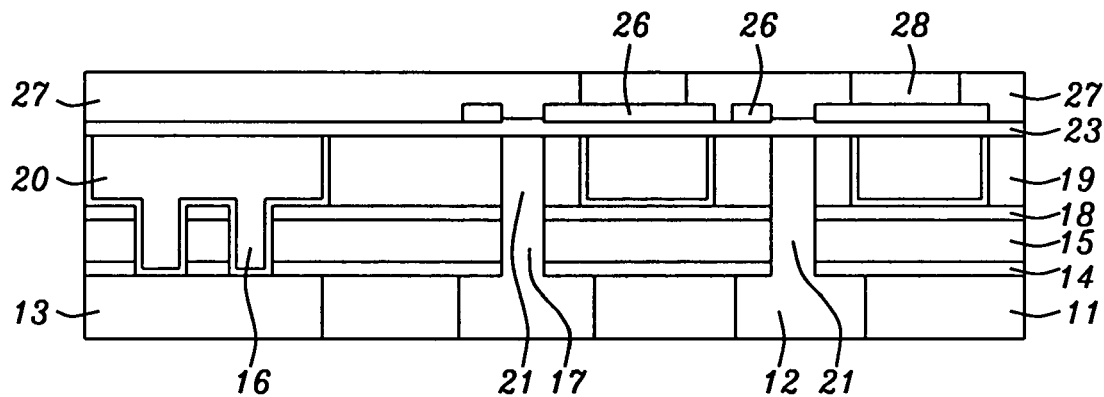

Referring next to schematic FIG. 7f, there is shown the results of depositing and patterning an MTJ cell (28), followed by the deposition of a blanketing dielectric refill layer (27) to isolate MTJ cells. The refill layer (27) is then planarized by a process of chemical mechanical polishing (CMP), leaving a smooth and planar surface.

Figure 7G:
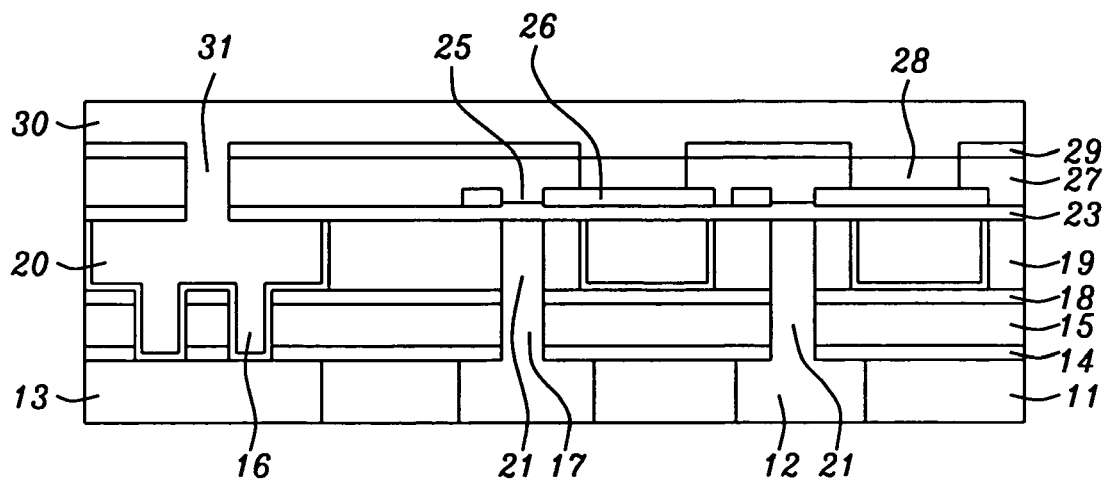

Referring finally to schematic FIG. 7g, there is shown the fabrication of FIG. 6f on which a final capping layer (29) has been formed and a bit line (30) has been formed on (29) by a double damascene process. A via (31) is formed through (23), (27) and (29). This via will connect the word line connection pad (20) to the bit line about to be formed. Additional openings in (29) have been made over the MTJ cells (28) so they may contact the bit line.

SUMMARY

The overall process flow described in the First Embodiment and illustrated by FIG. 4a-4g, is rendered more efficient than the prior art process flow of FIG. 3a-3g by combining two CMP processes into a single dual damascene process. Application of this simplification required that the word line not be clad. Specifically, the elements (16), (17), (20), (21), (22) and (24) that were produced in two CMP processes in the prior art of FIG. 3a-FIG. 3g, were now produced in a single dual damascene process in the process steps of FIG. 4a-FIG. 4g.

When the word line requires cladding, however, the same simplification can not be achieved. Instead, the process steps of the Second, Third and Fourth Embodiments, allow the fabrication of clad damascene structures to be advantageously divided into separate pattern and etch steps, so that unwanted cladding need not be applied to elements that are close to MTJ cells. In FIG. 3a-FIG. 3g, for example, elements (20), (21) and (24) are produced in the same masking process as element (22). As a result, elements (21) and (24) become unnecessarily and disadvantageously clad. The elimination of interference between cladding material and magnetic elements, is of increasing importance as the size of integrated circuit elements continues to decrease.

As is finally understood by a person skilled in the art, the preferred embodiments of the present invention are illustrative of the present invention rather than limiting of the present invention. Revisions and modifications may be made to methods, materials, structures and dimensions employed in forming and providing an MTJ MRAM device formed by the integration of a CMOS level and a memory level, and a method of its formation, wherein a process flow has been simplified and rendered more efficient, cost effective and scalable, while still forming and providing such a device and its method of formation in accord with the spirit and scope of the present invention as defined by the appended claims.

What is claimed is:

1. A method for integrating a magnetic memory level with a CMOS level in an MRAM device comprising:
   providing the CMOS level;
   forming a first etch-stop/capping layer on said CMOS level;
   forming a first dielectric layer on said etch-stop/capping layer;
   forming a second etch-stop layer on said first dielectric layer;
   forming a second dielectric layer on said second etch-stop layer; then, in a first pattern and etch process:
   etching two laterally separated, parallel lines of N uniformly spaced word line connection pad vias wherein each said line of vias is disposed along a lateral edge of said CMOS level and, etching between said parallel lines an N×M two dimensional array of memory device connection vias, said etch penetrating said first and second dielectric layers and said second etch-stop layer, but stopping at and exposing said first etch stop layer; then, in a second pattern and etch process:

etching, through said second dielectric layer and said second etch-stop layer but stopping at said first dielectric layer, M uniformly spaced parallel word line trenches and N uniformly spaced word line connection pad trenches, wherein said word line trenches are parallel to and between said two laterally separated lines of N word line connection pad vias, and wherein each of said N word line connection pad trenches is disposed above one of N uniformly spaced word line connection pad vias; wherein said second etch process also removes those portions of said first etch-stop layer exposed in said first pattern and etch process; then, in a first dual-damascene process, filling all trenches and vias with conducting metal; then forming a word line capping layer over said fabrication; and opening the tops of said N×M array of memory device connection vias through said word line capping layer; then forming and patterning a bottom electrode layer over said capping layer, whereby N×M individual bottom electrodes are formed and whereby each said individual bottom electrode electrically contacts one of said memory device connection vias; then forming and planarizing a third blanket dielectric layer on said bottom electrodes; and forming and patterning a memory device on each said bottom electrode layer; then depositing and planarizing a fourth blanket dielectric layer over said memory devices; then, in a dual damascene process forming a conducting via from an upper surface of each said word line connection pads through said word line capping layer and said fourth blanket dielectric layer and forming N parallel bit lines contacting said conducting via and said memory devices, wherein a single memory device is positioned at each intersection of a bit line and a word line.

2. The method of claim 1 where N can be between 36 and 98 and M can be between 256 and 1024.

3. The method of claim 1 where the first, second and third dielectric layers are layers of $SiO_2$ formed to a thickness between approximately 500 angstroms and 3000 angstroms.

4. The method of claim 1 where the fourth dielectric layer is a layer of $SiO_2$ formed to a thickness between approximately 800 angstroms and 5000 angstroms.

5. The method of claim 1 where the etch-stop and capping layers are layers of SiN or SiNC formed to a thickness between approximately 300 angstroms and 1500 angstroms.

6. The method of claim 1 wherein said word line has a width between approximately 0.2 microns and 0.5 microns and a depth between approximately 0.1 microns and 1.0 microns.

7. A method for integrating a magnetic memory level with a CMOS level in an MRAM device comprising:

providing the CMOS level;

forming a first capping/etch-stop layer on said CMOS level;

forming a first dielectric layer on said first capping/etch-stop layer;

forming a second etch-stop layer on said first dielectric layer;

forming a second dielectric layer on said second etch-stop layer; then, in a single damascene process:

forming an N×M two dimensional array of conductor filled memory device connection vias, said vias contacting CMOS landing pads in said CMOS level; then forming a third etch-stop layer over said vias and said second dielectric layer and forming a third dielectric layer on said third etch-stop layer; then in a dual damascene process, forming M, parallel, lined, conductor filled word lines and, along two, separated single lines parallel to said word lines and laterally displaced therefrom, forming N clad, uniformly spaced word line connection pads; wherein said M clad word line connection pads include clad vias extending beneath said connection pads, wherein said clad vias penetrate said first and second etch-stop layers and said first dielectric layer and contact a CMOS metal landing pad within said CMOS level; and wherein clad word lines and said clad word line connection pads are formed through said third dielectric layer, said third etch-stop layer and said second dielectric layer; then removing by a CMP process said third dielectric layer and said third etch-stop layer to expose said word lines and said word line connection pads; then forming a word line capping layer on said second dielectric layer, said word lines and said word line connection pads; then opening the tops of said second plurality of memory device connection vias through said word line capping layer; then forming and patterning a bottom electrode layer over said capping layer, whereby N×M individual bottom electrodes are formed and whereby each said individual bottom electrode electrically contacts one of said memory device connection vias; then forming and planarizing a third blanket dielectric layer on said bottom electrodes; and forming and patterning a memory devices on each said bottom electrode layer; then depositing and planarizing a fourth blanket dielectric layer over said memory devices; then, in a dual damascene process forming a conducting via from an upper surface of each said word line connection pads through said word line capping layer and said fourth blanket dielectric layer and forming N parallel bit lines contacting said conducting via and said memory devices, wherein a single memory device is positioned at an intersection of a bit line and a word line.

8. The method of claim 7 where N can be between 36 and 98 and M can be between 256 and 1024.

9. The method of claim 7 where the first, second and third dielectric layers are layers of $SiO_2$ formed to a thickness between approximately 500 angstroms and 3000 angstroms.

10. The method of claim 7 where the fourth dielectric layer is a layer of $SiO_2$ formed to a thickness between approximately 800 angstroms and 5000 angstroms.

11. The method of claim 7 where the etch-stop and capping layers are layers of SiN or SiNC formed to a thickness between approximately 300 angstroms and 1500 angstroms.

12. The method of claim 7 wherein said word line has a width between approximately 0.2 microns and 0.5 microns and a depth between approximately 0.1 microns and 1.0 microns.

13. A method for integrating a magnetic memory level with a CMOS level in an MRAM device comprising:

providing the CMOS level;

forming a first etch-stop layer on said CMOS level;

forming a first dielectric layer on said first etch-stop level;

forming a second etch-stop layer on said first dielectric layer;

forming a second dielectric layer on said second etch-stop layer; then, in a dual damascene process:

forming M, parallel, lined, conductor filled word lines and, along each of two single lines parallel to said word lines and disposed along lateral ends of said CMOS level, forming N lined, uniformly spaced word line connection pads; wherein each of aid N lined word line connection pads include lined vias extending beneath said connection pads, wherein said lined vias penetrate said first and second etch-stop layers and said first dielectric layer and contact a CMOS metal landing pad within said CMOS level; and wherein said lined word lines and said lined word line connection pads are formed through said third dielectric layer, said third etch-stop layer and said second dielectric layer; then, in a single damascene process forming an N×M two dimensional array of conductor filled memory device connection vias, said vias contacting CMOS landing pads in said CMOS level; then forming a third etch-stop layer over said memory device connection vias and said second dielectric layer and then opening said third etch-stop layer to expose openings to said device connection vias; then forming and patterning a bottom electrode layer over said capping layer, whereby N×M individual bottom electrodes are formed and whereby each said individual bottom electrode electrically contacts one of said memory device connection vias; then forming and planarizing a third blanket dielectric layer on said bottom electrodes; and forming and patterning a memory devices on each said bottom electrode layer; then depositing and planarizing a fourth blanket dielectric layer over said memory devices; then, in a dual damascene process forming a conducting via from an upper surface of each said word line connection pads through said word line capping layer and said fourth blanket dielectric layer and forming M parallel bit lines contacting said conducting via and said memory devices, wherein a single memory device is positioned at an intersection of a bit line and a word line.

14. The method of claim 13 where N can be between 36 and 98 and M can be between 256 and 1024.

15. The method of claim 13 where the first, second and third dielectric layers are layers of SiO$_2$ formed to a thickness between approximately 500 angstroms and 3000 angstroms.

16. The method of claim 13 where the fourth dielectric layer is a layer of SiO$_2$ formed to a thickness between approximately 800 angstroms and 5000 angstroms.

17. The method of claim 13 where the etch-stop and capping layers are layers of SiN formed to a thickness between approximately 300 angstroms and 1500 angstroms.

18. The method of claim 13 wherein said word line has a width between approximately 0.2 microns and 0.5 microns and a depth between approximately 0.1 microns and 1.0 microns.

19. A method for integrating a magnetic memory level with a CMOS level in an MRAM device comprising:

providing the CMOS level;

forming a first etch-stop layer on said CMOS level;

forming a first dielectric layer on said first etch-stop level; then, in a single damascene process forming two parallel lines of N uniformly spaced word line connection pad vias wherein each line is disposed a lateral end of said CMOS level and, between said lines, forming an N×M two dimensional array of memory device connection vias, said vias penetrating said first dielectric layer and said first etch-stop layer whereby said word line connection pad vias contact metal landing pad connections in said CMOS level and said memory device connection vias contact metal landing pads for memory devices in said CMOS level; then forming a second etch-stop layer over said vias and said first dielectric layer; then forming a second dielectric layer on said second etch-stop layer; then, in a first of two single damascene processes, forming in said second dielectric layer M uniformly spaced, parallel, clad word lines, and above each of said word line connection vias, forming N uniformly spaced, clad word line connection pads; and in the second of two single damascene processes, extending said N×M two dimensional, unclad array of memory device connection vias through said second dielectric layer; then forming a word line capping layer on said first planar dielectric layer and opening said capping layer to expose said memory device connection vias;

forming and patterning a bottom electrode layer over said capping layer, whereby N×M individual bottom electrodes are formed and whereby each said individual bottom electrode electrically contacts one of said memory device connection vias; then forming and planarizing a third blanket dielectric layer on said bottom electrodes; and forming and patterning a memory devices on each said bottom electrode layer; then depositing and planarizing a fourth blanket dielectric layer over said memory devices; then, in a dual damascene process forming M parallel bit lines contacting said memory devices, wherein a single memory device is positioned at each intersection of a bit line and a word line.

20. The method of claim 19 where N can be between 36 and 98 and M can be between 256 and 1024.

21. The method of claim 19 where the first, second and third dielectric layers are layers of SiO$_2$ formed to a thickness between approximately 500 angstroms and 3000 angstroms.

22. The method of claim 19 where the fourth dielectric layer is a layer of SiO$_2$ formed to a thickness between approximately 800 angstroms and 5000 angstroms.

23. The method of claim 19 where the etch-stop and capping layers are layers of SiN formed to a thickness between approximately 300 angstroms and 1500 angstroms.

24. The method of claim 19 wherein said word line has a width between approximately 0.2 microns and 0.5 microns and a depth between approximately 0.1 microns and 1.0 microns.

25. The method of claim 1 wherein said memory cells are MTJ cells.

26. The method of claim 7 wherein said memory cells are MTJ cells.

27. The method of claim 13 wherein said memory cells are MTJ cells.

28. The method of claim 19 wherein said memory cells are MTJ cells.

* * * * *